(12) United States Patent
Li et al.

(10) Patent No.: US 11,396,454 B2
(45) Date of Patent: Jul. 26, 2022

(54) NEGATIVE THERMAL EXPANSION MATERIAL, NEGATIVE THERMAL EXPANSION FILM AND PREPARATION METHOD THEREOF

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Wei Li, Beijing (CN); Pan Guo, Beijing (CN); Yanqing Chen, Beijing (CN); Ning Wang, Beijing (CN); Weida Qin, Beijing (CN); Haoyi Xin, Beijing (CN); Yanfeng Li, Beijing (CN); Chao Li, Beijing (CN); Yongchao Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 630 days.

(21) Appl. No.: 16/332,125

(22) PCT Filed: Jul. 17, 2018

(86) PCT No.: PCT/CN2018/095991
§ 371 (c)(1),
(2) Date: Mar. 11, 2019

(87) PCT Pub. No.: WO2019/042033
PCT Pub. Date: Mar. 7, 2019

(65) Prior Publication Data
US 2021/0331936 A1      Oct. 28, 2021

(30) Foreign Application Priority Data

Aug. 30, 2017    (CN) .......................... 201710766171.9

(51) Int. Cl.
*C23C 14/08*     (2006.01)
*C01G 45/12*    (2006.01)
(Continued)

(52) U.S. Cl.
CPC .......... *C01G 45/1264* (2013.01); *C23C 14/08* (2013.01); *C23C 14/3464* (2013.01);
(Continued)

(58) Field of Classification Search
CPC ....... C01G 45/1264; C23C 4/08; C23C 4/081; C23C 4/087; C23C 4/088
See application file for complete search history.

(56) References Cited

U.S. PATENT DOCUMENTS

| 5,322,559 A | 6/1994 | Sleight |
| 7,048,836 B2 | 5/2006 | Saruhan-Brings et al. |

(Continued)

FOREIGN PATENT DOCUMENTS

| CN | 1850721 A | 10/2006 |
| CN | 100349823 C | 11/2007 |

(Continued)

OTHER PUBLICATIONS

Deng et al., Synthesis, structure and magnetic properties of (Eu1-xMnx)MnO3-d, RSC Adv., 2017, 7, 2019 (Published on Jan. 13, 2017) (Year: 2017).*

(Continued)

*Primary Examiner* — Hoa (Holly) Le
(74) *Attorney, Agent, or Firm* — Calfee, Halter & Griswold LLP

(57) ABSTRACT

A negative thermal expansion material and a preparation method thereof, and a negative thermal expansion film and
(Continued)

a preparation method thereof are provided. The negative thermal expansion material includes $Eu_{0.85}Cu_{0.15}MnO_{3-\delta}$, wherein $0 \leq \delta \leq 2$.

10 Claims, 2 Drawing Sheets

(51) Int. Cl.
  *C23C 14/34* (2006.01)
  *C23C 14/35* (2006.01)
  *H05K 1/02* (2006.01)
(52) U.S. Cl.
  CPC ............ *C23C 14/35* (2013.01); *H05K 1/0271* (2013.01); *C01P 2002/72* (2013.01); *C01P 2002/88* (2013.01); *C01P 2006/32* (2013.01); *H05K 2201/068* (2013.01)

(56) References Cited

U.S. PATENT DOCUMENTS

| | | |
|---|---|---|
| 7,105,236 B2 | 9/2006 | Saruhan-Brings et al. |
| 2002/0197503 A1 | 12/2002 | Saruhan-Brings et al. |
| 2003/0218268 A1 | 11/2003 | Morito et al. |
| 2006/0019107 A1 | 1/2006 | Saruhan-Brings et al. |

FOREIGN PATENT DOCUMENTS

| | | |
|---|---|---|
| CN | 104193337 A | 12/2014 |
| CN | 106220159 A | 12/2016 |
| CN | 107573070 A | 1/2018 |
| EP | 1256636 A2 | 11/2002 |
| EP | 1256636 A3 | 5/2003 |
| EP | 1256636 B1 | 6/2006 |
| JP | 2003342075 A | 12/2003 |
| JP | 2010101153 A1 | 9/2012 |
| WO | 2010101153 A1 | 9/2010 |
| WO | WO2010101153 A1 | 9/2012 |

OTHER PUBLICATIONS

Zhang et al., Solubility limits, crystal structure and lattice thermal expansion of Ln2O3 (Ln=Sm, Eu, Gd) doped CeO2, Journal of Alloys and Compounds, vol. 718, Sep. 25, 2017, pp. 85-91. (Available Online May 10, 2017) (Year: 2017).*
Li et al., Negative thermal expansion property of Sm1-xCuxMnO3-δ, Journal of Materials Research and Technology, vol. 12, May-Jun. 2021, pp. 2267-2272 (Year: 2021).*
Search Report and Written Opinion for International Application No. PCT/CN2018/095991 dated Sep. 30, 2018.
First Office Action for Chinese Patent Application No. 201710766171.9 dated May 8, 2019.
Pawel Plonczak, "Electrochemical properties of dense (LA,Sr) MnO3-δ films produced by pulsed laser deposition," Solid State Ionics 217 (2012) pp. 54-61.
Tadashi Shiota et al., "Thermal radiative properties (La1-xSrx) MnO3-δ thin films fabricated on yttria-stabilized zirconia single-crystal substrate by pulsed laser deposition," Thin Solid Films; 593 (2015) pp. 1-4.
Yu-Xiang Li, "Preparation, Thermal Expansion Properties and Mechanisms of SM1-xCuxMnO3-δ Negative Expansion Materials and SrTIO3-ZrMgMo3O12 Composites," Engineering Science, Apr. 2016.
Cunyuan Liu Negative thermal expansion property of Eu1-xSrxMnO3-δ (x=0.1, 0.15, 0.2) and Gd0.5Eu0.5) 0.8Sr0.2MnO3; Degree Dissertation, Apr. 2016.
Cunyuan Liu Negative thermal expansion property of Eu1-xSrxMnO3-δ (x=0.1, 0.15, 0.2) and Gd0.5Eu0.5) 3.8Sr0.2MnO3; Degree Dissertation, Apr. 2016.

* cited by examiner

NEGATIVE THERMAL EXPANSION MATERIAL, NEGATIVE THERMAL EXPANSION FILM AND PREPARATION METHOD THEREOF

CROSS-REFERENCE TO RELATED APPLICATIONS

The present application is based upon International Application No. PCT/CN2018/095991, filed on Jul. 17, 2018, which claims the priority to the Chinese Patent Application No. 201710766171.9, entitled "NEGATIVE THERMAL EXPANSION MATERIAL, NEGATIVE THERMAL EXPANSION FILM AND PREPARATION METHOD THEREOF", filed on Aug. 30, 2017, the entire contents of which are hereby incorporated by reference.

TECHNICAL FIELD

The present disclosure relates to the field of negative thermal expansion materials, and in particular to a negative thermal expansion material, a negative thermal expansion film and a preparation method thereof.

BACKGROUND

Thermal expansion is a universal problem urgently needed to be solved in many fields, such as precision machinery, electronics, optics, communications, and structural materials. The mechanism of positive thermal expansion is that lattice vibrations increase with increasing temperature, resulting in an increase in the length or volume of the material. With the continuous deep research on negative thermal expansion materials, it is found that when the lattice vibration and some other physical effects act on the material at the same time, a phenomenon of negative thermal expansion will occur when the degree of thermal shrinkage caused exceeds the degree of thermal expansion caused by lattice vibration. The mechanism of this phenomenon is currently being extensively studied.

Negative thermal expansion materials have broad application prospects in the fields of communication, electronics, precision machinery and fuel cells. They can be used separately in some fields requiring heat shrinkage and cold expansion, and can also be used as a part of a composition material to adjust a coefficient of thermal expansion of the composite material, thereby manufacturing the composite material with a controllable coefficient of expansion to meet actual needs.

Therefore, it is necessary to develop more negative thermal expansion materials with wider negative thermal expansion temperature range, stable negative thermal expansion performance and simple preparation process.

SUMMARY

The present disclosure provides a negative thermal expansion material and a preparation method thereof, and a negative thermal expansion film and a preparation method thereof.

According to an aspect of the present disclosure, a negative thermal expansion material is provided, including $Eu_{0.85}Cu_{0.15}MnO_{3-\delta}$, wherein $0 \leq \delta \leq 2$.

In an embodiment of the present disclosure, the negative thermal expansion material is formed from $Eu_2O_3$, CuO, and $Mn_2O_3$ powders by using a solid state sintering method.

According to an aspect of the present disclosure, a method for preparing a negative thermal expansion material is provided, including the following steps: mixing $Eu_2O_3$, CuO, and $Mn_2O_3$ powders in a molar ratio of Eu:Cu:Mn=0.85:0.15:1; drying the powers mixed; molding the powders dried by pressing; and sintering the powders molded by pressing at a temperature above 1073K.

In an embodiment of the present disclosure, the mixing the $Eu_2O_3$, CuO, and $Mn_2O_3$ powders includes: firstly dry grinding the $Eu_2O_3$, CuO, and $Mn_2O_3$ powders for 0.5 hours to 1.5 hours; and then grinding $Eu_2O_3$, CuO, and $Mn_2O_3$ powders for 0.5 hours to 1.5 hours with adding of anhydrous ethanol.

In an embodiment of the present disclosure, the sintering the powders molded by pressing at a temperature above 1073K includes: heating the powers molded by pressing from a room temperature to 1173 K to 1373 K at a heating rate of 3 K/min to 8 K/min, and maintaining the temperature of 1173 K to 1373 K for 10 hours to 24 hours.

According to an aspect of the present disclosure, a negative thermal expansion film is provided, including the above negative thermal expansion material.

According to an aspect of the present disclosure, a method for preparing a negative thermal expansion film is provided, including the following steps: preparing an $Eu_2O_3$ target, a CuO target, and an $Mn_2O_3$ target, respectively; providing a substrate; placing the $Eu_2O_3$ target, the CuO target, the $Mn_2O_3$ target and the substrate in a reaction chamber; depositing $Eu_2O_3$, CuO, and $Mn_2O_3$ film on the substrate by bombarding the targets, wherein the molar ratio of Eu, Cu and Mn is controlled to be 0.85:0.15:1; and maintaining the film deposited at a temperature above 1073K.

In an embodiment of the present disclosure, the molar ratio of Eu, Cu, Mn is controlled by controlling the deposition time of the film.

In an embodiment of the present disclosure, the targets are bombarded by a radio frequency magnetron sputtering method or a pulsed laser method.

According to an aspect of the present disclosure, a zero expansion material is provided, including the above negative thermal expansion material.

According to an aspect of the present disclosure, a zero expansion composite film is provided, including the above negative thermal expansion film.

According to an aspect of the present disclosure, an integrated circuit board is provided, including the above negative thermal expansion film.

DETAILED DESCRIPTION

Figure 1:
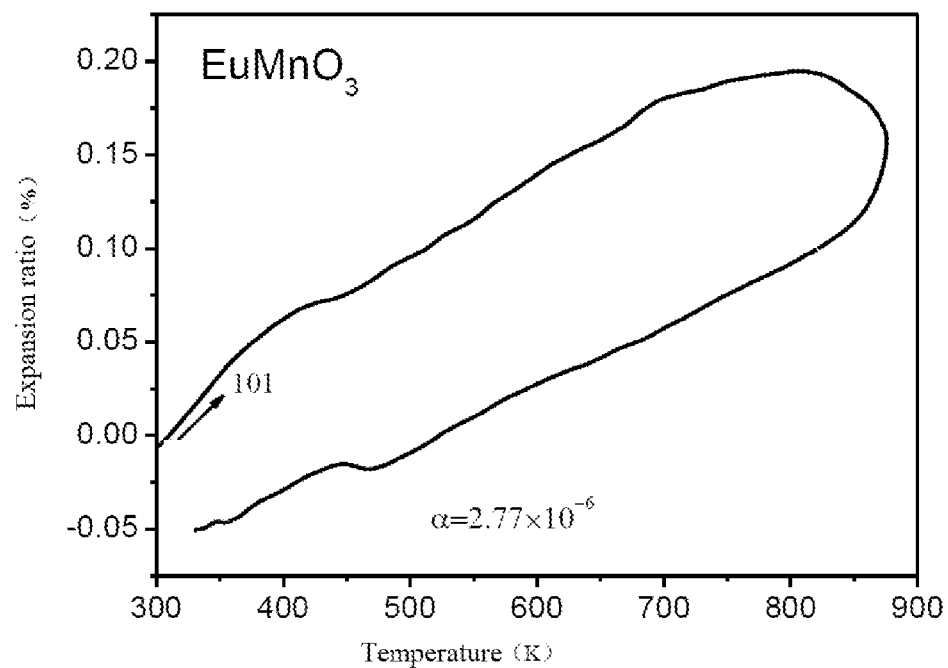
FIG. 1 is a graph of expansion ratio of $EuMnO_3$ material as a function of temperature.

The present disclosure will be further described in detail below in conjunction with the drawings and embodiments. It is understood that specific embodiments described herein are merely illustrative of the present disclosure and are not intended to be limiting. In addition, it should be noted that, for the convenience of description, only some but not all of the structures related to the present disclosure are shown in the drawings.

According to an exemplary embodiment of the present disclosure, a negative thermal expansion material is provided, including $Eu_{0.85}Cu_{0.15}MnO_{3-\delta}$, wherein $0 \leq \delta \leq 2$.

The negative thermal expansion material refers to a class of compounds whose average linear expansion coefficient or body expansion coefficient is negative within a certain temperature range, and is an emerging branch of discipline in material science in recent years. They can be classified into three types according to their crystallographic characteristics and negative thermal expansion properties: isotropic negative thermal expansion materials, anisotropic negative thermal expansion materials, and unshaped materials. The negative thermal expansion material is characterized by measuring the size of the material in a certain direction or in respective directions at different temperatures. In the case of an increase in temperature, a decrease in the size of the material indicates that the material is undergoing negative expansion, so it is called a negative thermal expansion material. The negative thermal expansion material can be combined with a general positive thermal expansion material to prepare a controllable coefficient of thermal expansion or a zero expansion material.

In one implementation, the negative thermal expansion material is formed from $Eu_2O_3$, CuO, and $Mn_2O_3$ powders by using a solid state sintering method.

In the negative thermal expansion material, the correlation vibration between metal and oxygen atoms at a high temperature in the original material is changed by doping the $EuMnO_3$ with $Cu^{2+}$ ions, and as a result, the unit cell volume of the material is reduced, thereby making the negative thermal expansion material with negative thermal expansion property.

Figure 2:
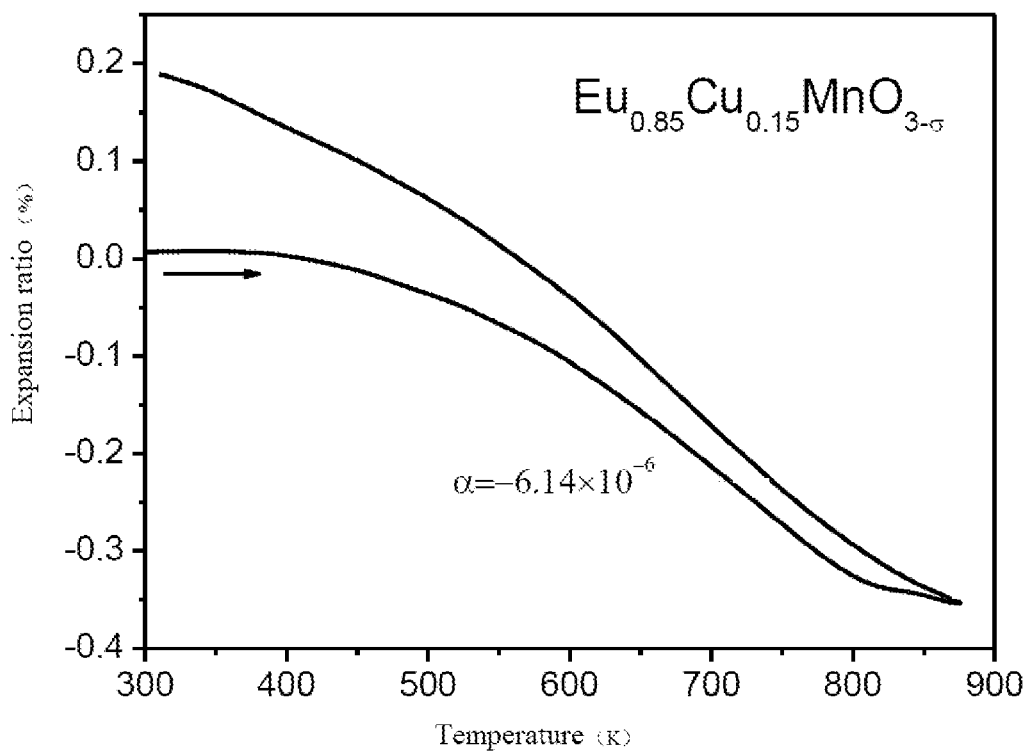
FIG. 2 is a graph of expansion ratio of $Eu_{0.85}Cu_{0.15}MnO_{3-\delta}$ material of an embodiment of the present disclosure as a function of temperature.

FIG. 1 is a graph of expansion ratio of $EuMnO_3$ material as a function of temperature. FIG. 2 is a graph of expansion ratio of $Eu_{0.85}Cu_{0.15}MnO_{3-\delta}$ material as a function of temperature.

As shown in FIG. 1, the arrow 101 in FIG. 1 indicates that the temperature is increasing, and the expansion ratio of the $EuMnO_3$ material gradually increases with temperature, and the coefficient of thermal expansion α of $EuMnO_3$ is $2.77 \times 10^{-6}$ by curve fitting.

As shown in FIG. 2, the arrow 201 in FIG. 2 indicates that the temperature is increasing, and the expansion ratio of $Eu_{0.85}Cu_{0.15}MnO_{3-\delta}$ material gradually decreases with the increase of temperature, and the coefficient of thermal expansion α of $Eu_{0.85}Cu_{0.15}MnO_{3-\delta}$ is $-6.14 \times 10^{-6}$ by curve fitting. It can be seen that the $Eu_{0.85}Cu_{0.15}MnO_{3-\delta}$ material is a negative thermal expansion material.

As for the negative thermal expansion material provided by the embodiment, the copper in $Eu_{0.85}Cu_{0.15}MnO_{3-\delta}$ is doped in the form of copper ions, thereby realizing the negative expansion of the material when the temperature is increasing, which has wide application.

According to an exemplary embodiment of the present disclosure, a method for preparing a negative thermal expansion material is provided, including the following steps:

preparing $Eu_2O_3$ power, CuO power and $Mn_2O_3$ power, respectively; proportioning the $Eu_2O_3$, CuO, and $Mn_2O_3$ powders in a molar ratio of Eu:Cu:Mn=0.85:0.15:1; mixing the powers; drying the powers mixed; molding the powder dried by pressing; sintering the powders molded by pressing at a temperature above 1073K.

Specifically, the method for preparing the negative thermal expansion material according to the embodiment includes the following two main processes.

(1) Preparation of Raw Materials

The raw materials are analytically pure $Eu_2O_3$ (purity≥99.5%), CuO (purity≥99.5%) and $Mn_2O_3$ powder. The $Mn_2O_3$ powder is prepared by keeping the analytically pure $MnO_2$ (purity≥99.5%) powder in a box furnace at 650° C. for 10 hours.

(2) Preparation of Sample

The $Eu_2O_3$, CuO, and $Mn_2O_3$ powers are proportioned in a molar ratio of Eu:Cu:Mn=0.85:0.15:1; firstly the $Eu_2O_3$, CuO, and $Mn_2O_3$ powers are dry grinded in an agate mortar for 0.5 hours to 1.5 hours, optionally for 1 hour, and then are grinded for 0.5 hours to 1.5 hours, optionally 1 hour, with adding of anhydrous ethanol, and then are dried in a drying oven at a temperature of 353 K for 1 hour. The $Eu_2O_3$, CuO, and $Mn_2O_3$ powers are pressed into a disc-shaped semifinished base (Φ 10×5 mm) by a powder tableting machine. The semifinished base is put into the high-temperature furnace and heated from room temperature (about 293K) to 1173 K to 1373K (optionally about 1273K) at a heating rate of 3 K/min to 8K/min (optionally about 5 K/min), and then the temperature is maintained for 10 hours to 24 hours. Finally, the temperature is naturally dropped to room temperature to obtain the sample.

Figure 3:
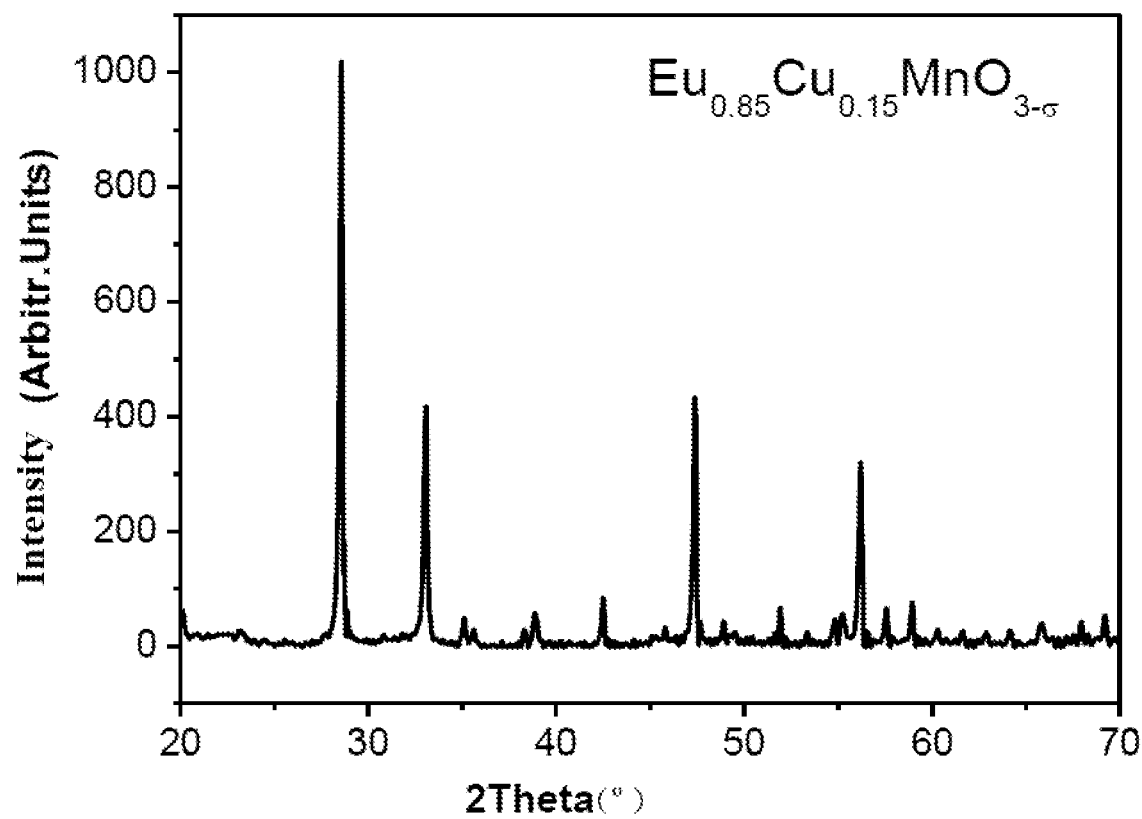
FIG. 3 is a graph of energy spectrum analysis of a prepared material of an embodiment of the present disclosure.

FIG. 3 is a graph of energy spectrum analysis of a prepared material according to the present embodiment. As shown in FIG. 3, the composition of the obtained material is $Eu_{0.85}Cu_{0.15}MnO_{3-\delta}$. The composition of the obtained material can be determined by energy spectrum analysis, and then the content of each powder in the sample preparation can be adjusted to obtain a material with the desired composition.

In the method of preparing a negative thermal expansion material provided by the embodiment, the copper in $Eu_{0.85}Cu_{0.15}MnO_{3-\delta}$ is doped in the form of copper ions, thereby realizing the negative expansion of the material when the temperature is increasing. Also, the preparation method is simple and the cost is low.

According to an exemplary embodiment of the present disclosure, a negative thermal expansion film with the same composition as the material of the above embodiment is provided, except that the material is formed into a film, which is advantageous for wider application of the material. The film includes the negative thermal expansion material of $Eu_{0.85}Cu_{0.15}MnO_{3-\delta}$, wherein $0 \leq \delta \leq 2$.

The negative thermal expansion film in the embodiment can be prepared by a radio frequency magnetron sputtering method or a pulsed laser deposition method.

In the negative thermal expansion film provided by the embodiment, the copper in $Eu_{0.85}Cu_{0.15}MnO_{3-\delta}$ is doped in the form of copper ions, thereby realizing the negative expansion of the film when the temperature is increasing, which has wide application.

According to an exemplary embodiment of the present disclosure, a method for preparing a negative thermal expansion film is provided, including the following steps:

preparing an $Eu_2O_3$ target, a CuO target, and an $Mn_2O_3$ target, respectively; providing a substrate; placing the $Eu_2O_3$ target, the CuO target, the $Mn_2O_3$ target and the substrate in a reaction chamber; depositing $Eu_2O_3$, CuO, and $Mn_2O_3$ film on the substrate by bombarding the targets, wherein the molar ratio of Eu, Cu and Mn is controlled to be 0.85:0.15:1; and maintaining the film deposited at a temperature above 1073K.

The bombarding the targets includes using the radio frequency magnetron sputtering method or the pulsed laser method to bombard the targets.

When the radio frequency magnetron sputtering method is used to bombard the targets, the process parameters for depositing $Eu_2O_3$, CuO and $Mn_2O_3$ film on the substrate can be the parameters used in common magnetron sputtering, for example, the radio frequency deposition power is 150 W~300 W, the vacuum degree is $1.0 \times 10^{-3}$ Pa~$2.0 \times 10^{-4}$ Pa, the working pressure is 1 Pa~3 Pa, the working atmosphere is a mixed gas of argon and oxygen, and the deposition time is 60 minutes to 240 minutes. During the deposition process, the amount of $Eu_2O_3$, CuO and $Mn_2O_3$ is controlled by controlling the deposition time, thereby controlling the molar ratio of bismuth, copper and manganese in the film obtained by deposition on the substrate.

When the pulsed laser method is used to bombard the targets, the process parameters of depositing $Eu_2O_3$, CuO and $Mn_2O_3$ film on the substrate can be the parameters used in common pulsed laser method, for example, the vacuum degree is $1.0 \times 10^{-3}$ Pa to $2.0 \times 10^{-4}$ Pa, the working pressure is 2 Pa~20 Pa, the working atmosphere is high purity oxygen, the laser energy density after focusing is 300 $mJ/cm^2$~500 $mJ/cm^2$, the pulse width is 5 ns~30 ns, the pulse frequency is 5 Hz, the deposition time is 30 minutes~60 Minutes. During the deposition process, the amount of $Eu_2O_3$, CuO and $Mn_2O_3$ is controlled by controlling the deposition time, thereby controlling the molar ratio of bismuth, copper and manganese in the film obtained by deposition on the substrate.

In the method for preparing a negative thermal expansion film provided by the present embodiment, the copper in $Eu_{0.85}Cu_{0.15}MnO_{3-\delta}$ is doped in the form of copper ions, thereby realizing the negative expansion of the film material when the temperature is increasing, which has a wide application. Also, the preparation method is simple and the cost is low.

According to an exemplary embodiment of the present disclosure, a zero expansion material is provided, including the negative thermal expansion material as described in the above embodiments. The zero expansion material may include a positive thermal expansion material in addition to the negative thermal expansion material. The material with zero expansion at a high temperature is obtained by adjusting the composition relationship of the negative thermal expansion material and the positive thermal expansion material according to the expansion ratios thereof.

According to an exemplary embodiment of the present disclosure, a zero-expansion composite film is provided including the negative thermal expansion film as described in the above embodiments. The zero expansion composite film may include a positive thermal expansion material film in addition to the negative thermal expansion material film. The film with zero expansion at a high temperature is obtained by adjusting the composition relationship of the negative thermal expansion material film and the positive thermal expansion material film according to the expansion ratios thereof.

According to an exemplary embodiment of the present disclosure, an integrated circuit board including the negative thermal expansion film described in the above embodiments is provided.

The negative thermal expansion film provided by the present disclosure can be used in a wide variety of applications. For example, the negative thermal expansion film may be used as coating materials used on the surface of high-precision optical lens, to effectively reduce measurement inaccuracies caused by the increasing temperature. The negative thermal expansion film can further be applied for reflection grating to effectively reduce the measurement error and improve the measurement accuracy. The negative thermal expansion film can also be used in the biomedical industry. The adjustable thermal expansion materials are often applied to artificial teeth or bones, making it easy to form medical equipment with high expansion requirements along with other materials. In addition, in the field of electronics industry, the requirements for precision are very high. Usually, the thermal expansion material and crystalline silicon can be combined with a certain proportion to adjust the expansion coefficient of single crystal silicon in the integrated circuit board without affecting the performance of crystalline silicon.

It will be understood by those skilled in the art that the present disclosure is not limited to the specific embodiments described herein, and that various obvious modifications, readjustment and substitutions may be made by those skilled in the art without departing from the protection scope of the present disclosure. Therefore, the present disclosure has been described in detail by the above embodiments, but the present disclosure is not limited to the above embodiments. The present disclosure may include more other equivalent embodiments without departing from the present disclosure. The scope of the present disclosure is determined by the appended claims.

What is claimed is:

1. A negative thermal expansion film, comprising a negative thermal expansion material, wherein the negative thermal expansion material comprises $Eu_{0.85}Cu_{0.15}MnO_{3-\delta}$, $0 \leq \delta \leq 2$.

2. A zero expansion composite film, comprising the negative thermal expansion film of claim 1.

3. An integrated circuit board, comprising the negative thermal expansion film of claim 1.

4. A negative thermal expansion film, comprising a negative thermal expansion material, wherein the negative thermal expansion material comprises $Eu_{0.85}Cu_{0.15}MnO_{3-\delta}$, $0 \leq \delta \leq 2$, and the negative thermal expansion material is formed from $Eu_2O_3$, CuO and $Mn_2O_3$ powders by using a solid state sintering method.

5. A zero expansion composite film, comprising the negative thermal expansion film of claim 4.

6. An integrated circuit board, comprising the negative thermal expansion film of claim 4.

7. A method for preparing a negative thermal expansion film comprising a negative thermal expansion material comprising $Eu_{0.85}Cu_{0.15}MnO_{3-\delta}$, $0 \leq \delta \leq 2$, the method comprising:
preparing an $Eu_2O_3$ target, a CuO target, and an $Mn_2O_3$ target, respectively;
providing a substrate;
placing the $Eu_2O_3$ target, the CuO target, the $Mn_2O_3$ target and the substrate in a reaction chamber;
depositing $Eu_2O_3$, CuO, and $Mn_2O_3$ film on the substrate by bombarding the targets, wherein the molar ratio of Eu, Cu and Mn is controlled to be 0.85:0.15:1; and
maintaining the film deposited at a temperature above 1073K.

8. The method for preparing a negative thermal expansion film according to claim 7, wherein the targets are bombarded by one of a radio frequency magnetron sputtering method and a pulsed laser method.

9. The method for preparing a negative thermal expansion film according to claim 7, wherein the molar ratio of Eu, Cu, and Mn is controlled by controlling deposition time of the film.

10. The method for preparing a negative thermal expansion film according to claim 9, wherein the targets are bombarded by one of a radio frequency magnetron sputtering method and a pulsed laser method.

* * * * *